(12) United States Patent
Park

(10) Patent No.: US 7,868,855 B2
(45) Date of Patent: Jan. 11, 2011

(54) DRIVING CIRCUIT AND ORGANIC LIGHT EMITTING DIODE DISPLAY DEVICE THEREOF

(75) Inventor: Yong-sung Park, Suwon-si (KR)

(73) Assignee: Samsung Mobile Display Co., Ltd., Suwon-si, Gyeongg-do (KR)

( * ) Notice: Subject to any disclaimer, the term of this patent is extended or adjusted under 35 U.S.C. 154(b) by 838 days.

(21) Appl. No.: 11/878,534

(22) Filed: Jul. 25, 2007

(65) Prior Publication Data
US 2008/0074446 A1 Mar. 27, 2008

(30) Foreign Application Priority Data
Sep. 22, 2006 (KR) .................. 10-2006-0092492

(51) Int. Cl.
*G09G 3/30* (2006.01)
(52) U.S. Cl. .................. 345/77; 345/76; 341/144
(58) Field of Classification Search .................. 345/76, 345/77, 92, 98, 690; 341/144, 145, 154, 341/120, 118, 136
See application file for complete search history.

(56) References Cited

U.S. PATENT DOCUMENTS

| | | | |
|---|---|---|---|
| 5,952,948 A | 9/1999 | Proebsting | |
| 6,310,593 B1 | 10/2001 | Nakao | |
| 6,570,520 B2 | 5/2003 | Ishii | |
| 6,774,833 B2 * | 8/2004 | Tanaka | 341/144 |
| 7,236,114 B2 * | 6/2007 | Ahn | 341/144 |
| 7,268,763 B2 | 9/2007 | Fukuda et al. | |
| 7,369,075 B2 | 5/2008 | Ishii et al. | |
| 7,379,081 B2 * | 5/2008 | Park et al. | 345/690 |
| 2001/0048408 A1 * | 12/2001 | Koyama et al. | 345/76 |
| 2004/0217892 A1 * | 11/2004 | Hu et al. | 341/144 |
| 2005/0007315 A1 | 1/2005 | Yang et al. | |
| 2006/0125761 A1 * | 6/2006 | Ahn | 345/98 |
| 2006/0139286 A1 * | 6/2006 | Kida et al. | 345/98 |
| 2006/0232520 A1 * | 10/2006 | Park et al. | 345/76 |
| 2007/0279336 A1 * | 12/2007 | Park | 345/76 |
| 2007/0279341 A1 * | 12/2007 | Park | 345/77 |
| 2007/0279342 A1 * | 12/2007 | Park | 345/77 |
| 2008/0111772 A1 * | 5/2008 | Park | 345/76 |
| 2008/0111839 A1 * | 5/2008 | Park | 345/690 |

(Continued)

FOREIGN PATENT DOCUMENTS

CN 1 224 279 7/1999

(Continued)

*Primary Examiner*—Amare Mengistu
*Assistant Examiner*—Dmitriy Bolotin
(74) *Attorney, Agent, or Firm*—Lee & Morse, P.C.

(57) ABSTRACT

A driving circuit is capable of displaying various gray level values. The driving circuit generates a data voltage, includes a first decoder adapted to output first decoding signals using upper bits of a digital data signal, a switch unit adapted to select a first reference voltage and a second reference voltage corresponding to first decoding signals, the second reference voltage being lower than the first reference voltage, where two first decoding signals select identical first and second reference voltages, a second decoder adapted to output second decoding signals using lower bits of the digital data signal, and voltage distribution units are adapted to receive and distribute the selected first and second reference voltages, where one voltage distribution unit includes a data voltage generation unit adapted to receive two second decoding signals to generate a data voltage.

21 Claims, 7 Drawing Sheets

U.S. PATENT DOCUMENTS

| | | |
|---|---|---|
| 2008/0170116 A1* | 7/2008 | Nishibayashi et al. .... 348/14.02 |
| 2008/0218456 A1* | 9/2008 | Park et al. ..................... 345/77 |

FOREIGN PATENT DOCUMENTS

| | | |
|---|---|---|
| EP | 1 517 448 A1 | 3/2005 |
| JP | 02-246424 A | 10/1990 |
| JP | 06-077832 A | 3/1994 |
| JP | 06-268523 A | 9/1994 |
| JP | 08-234697 | 9/1996 |
| JP | 09-252240 | 9/1997 |
| JP | 11-296147 A | 10/1999 |
| JP | 2000-138586 A | 5/2000 |
| JP | 2002-076897 A | 3/2002 |
| JP | 2002-314421 A | 10/2002 |
| JP | 2003-273739 A | 9/2003 |
| JP | 2004-163456 A | 6/2004 |
| JP | 2006-197532 A | 7/2006 |
| KR | 10-2005-0007658 A | 1/2005 |
| KR | 10-2005-0080267 A | 8/2005 |

* cited by examiner

DRIVING CIRCUIT AND ORGANIC LIGHT EMITTING DIODE DISPLAY DEVICE THEREOF

BACKGROUND OF THE INVENTION

1. Field of the Invention

The present invention relates to a driving circuit and an organic light emitting diode display device thereof. More particularly, the present invention relates to a driving circuit capable of reducing gray level errors by preventing a voltage drop generated in an analog switch to improve linearity, and an organic light emitting diode display device thereof.

2. Description of the Related Art

A flat panel display may include a display region in which multiple pixels may be arranged in matrix form on a substrate, and an image may be displayed by connecting scan lines and data lines to each of the pixels to selectively apply a data signal to the pixels.

The flat panel display devices may be classified into a passive matrix type display devices and an active matrix type display devices, depending on the driving systems of the pixels. The active matrix type display devices, which selectively turn on the light in every unit pixel, have been widely used due to the favorable aspects of resolution, contrast, response time, etc.

The flat panel display devices have been used as displays or monitors of information appliances, e.g., personal computers, mobile phones, PDAs, etc. Other display types known in the art may include LCDs using a liquid crystal panel, organic light displays using an organic light emitting diode (OLED), plasma displays using a plasma display panel (PDP), etc.

In recent years, various flat panel displays devices have been developed which are light weight and small-sized when compared to cathode ray tubes. In particular, OLED display devices, which may have excellent luminous efficiency, excellent luminance, excellent viewing angle, and a rapid response time, are of particular interest.

SUMMARY OF THE INVENTION

The present invention is therefore directed to an OLED display device and a display driver, which substantially overcome one or more of the problems due to the limitations and disadvantages of the related art.

It is therefore a feature of an embodiment of the present invention to provide a light emitting diode display device which has a small specific luminous area, the OLED display device being capable of reducing a size of a data driver by diminishing an area of a D/A converter.

At least one of the above and other features and advantages of the present invention may be realized by providing a driving circuit for generating a data voltage, which may include a first decoder adapted to output multiple first decoding signals using upper bits of a digital data signal, a switch unit adapted to select a first reference voltage and second reference voltage from multiple reference voltages corresponding to the multiple first decoding signals, the second reference voltage being lower than the first reference voltage, where two first decoding signals select identical first and second reference voltages, a second decoder adapted to output multiple second decoding signals using lower bits of the digital data signal, and multiple voltage distribution units adapted to receive and distribute the first reference voltage and the second reference voltage, where one voltage distribution unit may include a data voltage generation unit adapted to receive two of the second decoding signals to generate a data voltage.

The switch unit may select two reference voltage lines from nine reference voltage lines to select the first reference voltage and the second reference voltage. The switch unit may include a first transistor adapted to receive a primary first decoding signal out of the multiple first decoding signals to switch the first reference voltage, a second transistor adapted to receive a secondary first decoding signal out of the multiple first decoding signals to switch the first reference voltage, a third transistor adapted to receive the primary first decoding signal to switch the second reference voltage, and a fourth transistor receiving the secondary first decoding signal to switch the second reference voltage. The primary first decoding signal and the secondary first decoding signal may be transmitted at different times. The data voltage generation unit may be adapted to receive the first reference voltage and the second reference voltage to generate multiple gray level voltages, where the data voltage generation unit may use a resistance ratio to generate four of the gray level voltages. The data voltage generation unit may include a first transistor adapted to switch the first reference voltage to correspond to a primary second decoding signal out of the multiple second decoding signals, a second transistor adapted to switch the first reference voltage to correspond to a secondary second decoding signal out of the multiple second decoding signals, a resistor array having first, second and third resistors connected in series, the resistor array being between the first reference voltage and the second reference voltage, a third transistor between the first and second resistors and adapted to output a gray level voltage of a data signal corresponding to the primary second decoding signal, and fourth transistor between the second and third resistors and adapted to output a gray level voltage of a data signal corresponding to the secondary second decoding signal. The primary second decoding signal and the secondary second decoding signal may be transmitted at different times.

At least one of the above and other features and advantages of the present invention may be realized by providing a data driver which may include a shift register unit adapted to sequentially output control signals, a latch unit adapted to output parallel digital data signals inputted in series corresponding to the control signal, a D/A converter unit adapted to convert the digital data signal to a data voltage, and a buffer unit amplifying the data voltage, where the D/A converter unit may include a first decoder adapted to output multiple first decoding signals using upper bits of a digital data signal, a switch unit adapted to select a first reference voltage and second reference voltage from multiple reference voltages to correspond the first decoding signals, the second reference voltage being lower than the first reference voltage, two first decoding signals out of the first decoding signals selecting identical first and second reference voltages, a second decoder adapted to output multiple second decoding signals using lower bits of the digital data signal, and multiple voltage distribution units adapted to receive and distribute the first reference voltage and the second reference voltage, where one voltage distribution unit may include a data voltage generation unit adapted to receive two second decoding signals to generate a data voltage.

At least one of the above and other features and advantages of the present invention may be realized by providing an organic light emitting diode display device which may include a pixel unit adapted to receive a data voltage and a scan signal, a data driver adapted to generate the data voltage, and a scan driver adapted to generate the scan signal, where the data driver may include a first decoder adapted to output multiple first decoding signals using upper bits of a digital data signal, a switch unit adapted to select a first reference voltage and second reference voltage from multiple reference voltages to correspond to multiple the first decoding signals, the second reference voltage being lower than the first reference voltage, two first decoding signals out of the first decoding signals selecting identical first and second reference voltages, a second decoder adapted to output multiple decoding signals using lower bits of the digital data signal, and multiple voltage distribution units adapted to receive and distribute the first reference voltage and the second reference voltage, where one voltage distribution unit may include a data voltage generation unit for receiving two second decoding signals to generate a data voltage.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
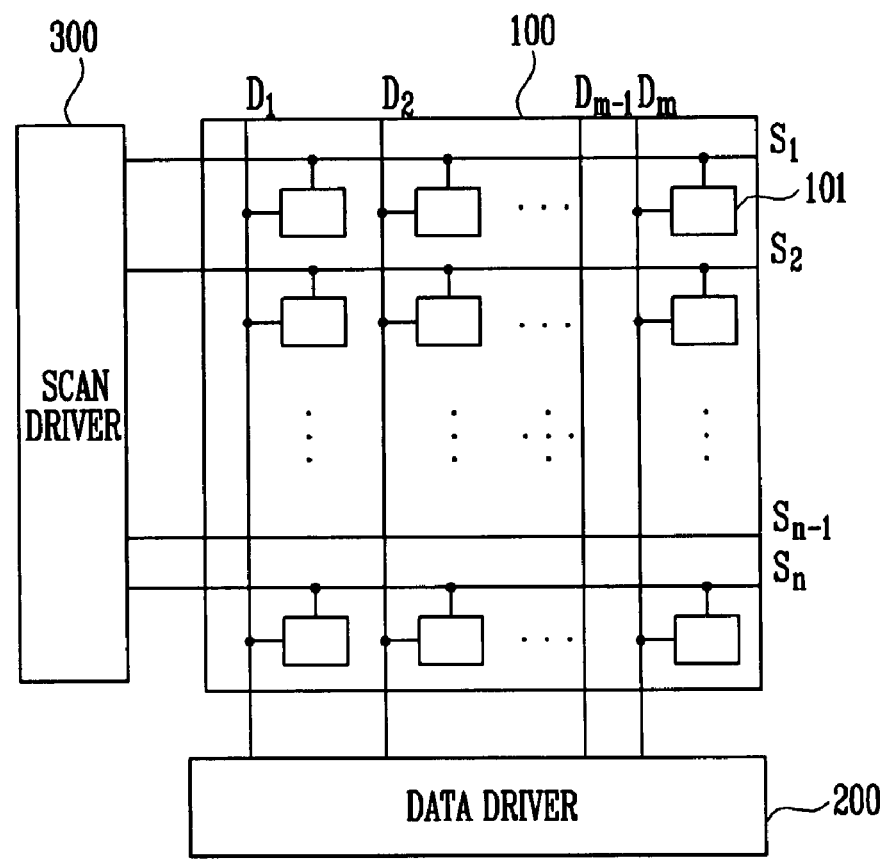
FIG. 1 illustrates a cross-sectional view of an OLED display device according to an embodiment of the present invention.

Korean Patent Application No. 10-2006-0092492, filed on Sep. 22, 2006, in the Korean Intellectual Property Office, and entitled: "Driving Circuit and Organic Light Emitting Diode Display Device Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions may be exaggerated for clarity of illustration.

Hereinafter, preferable embodiments according to the present invention will be described with reference to the accompanying drawings. Here, when one element is connected to another element, one element may be not only directly connected to another element but also indirectly connected to another element via another element. Further, irrelative elements are omitted for clarity. Also, like reference numerals refer to like elements throughout.

FIG. 1 illustrates a cross-sectional view of an OLED display device.

Referring to FIG. 1, the OLED display device may include a pixel unit 100, a data driver 200 and a scan driver 300. The pixel unit 100 may include multiple data lines D1, D2 . . . Dm-1, Dm, and multiple scan lines S1, S2 . . . Sn-1, Sn. Multiple pixels 101 may be defined by the multiple data lines D1, D2 . . . Dm-1, Dm, and the multiple scan lines S1, S2 . . . Sn-1, Sn. Each pixel 101 may include a pixel circuit and an OLED. The pixel circuit may generate a pixel current to allow the pixel current to flow to the OLED, the pixel current flowing to the pixels using a data signal being transmitted from the pixel circuit through the multiple data lines D1, D2 . . . Dm-1, Dm. A scan signal may be transmitted from the pixel circuit through the multiple scan lines S1, S2 . . . Sn-1, Sn.

The data driver 200 may be connected to the multiple data lines D1, D2 . . . Dm-1, Dm. The data driver 200 may generate a data signal to sequentially transmit the data signal of one row to the multiple data lines D1, D2 . . . Dm-1, Dm. The data driver 200 may have a D/A converter to generate a gray level voltage, to thereby transmit the generated gray level voltage to the data lines D1, D2 . . . Dm-1, Dm. The gray level voltage may convert the digital signal into an analog signal.

The scan driver 300 may be connected to the multiple scan lines S1, S2 . . . Sn-1, Sn. The scan driver 300 may generate a scan signal to transmit the generated scan signal to the multiple scan lines S1, S2 . . . Sn-1, Sn. A certain row may be selected by the scan signal, and then the data signal may be transmitted to the pixel 101 arranged in the selected row. The pixel 101 may thus generate an electric current to correspond to the data signal.

Figure 2:
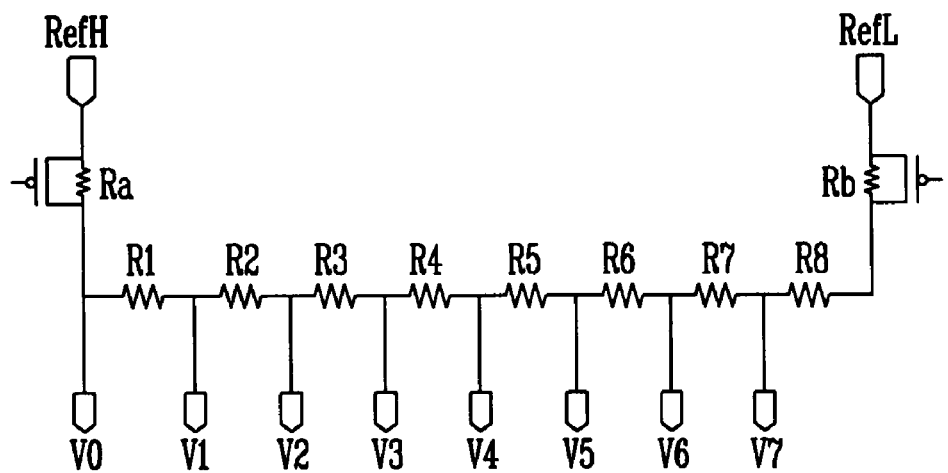
FIG. 2 illustrates a circuit view of a resistance unit for generating a gray level voltage in a D/A converter used in a data driver of the OLED display device of FIG. 1.

FIG. 2 illustrates a circuit diagram of a resistance unit for generating a gray level voltage in a D/A converter used in a data driver of the OLED display device illustrated in FIG. 1. Referring to FIG. 2, when the resistance unit generates eight gray level voltages V0, V1 . . . V7, eight resistors R1, R2 . . . R8 may be connected in series to generate the eight gray level voltages V0, V1 . . . V7. A first reference voltage RefH, which may be a high voltage, and a second reference voltage RefL, which may be a low voltage, may be transmitted to ends of the resistors connected in series. Voltages, into which the first reference voltage RefH and the second reference voltage RefL are distributed by the eight resistors, may become data voltages. A transistor between the first reference voltage RefH and the resistors may include a resistor Ra. A transistor between the second reference voltage ReFL and the resistors may include a resistor Rb.

The D/A converter as configured above may generate eight data voltages, namely 3-bit data voltages distributed by the eight resistors. Therefore, 256 resistors may be required for displaying an 8-bit data in the D/A converter as configured above. Accordingly, the size of the data driver may be increased with the increase in the size of the D/A converter.

Figure 3:
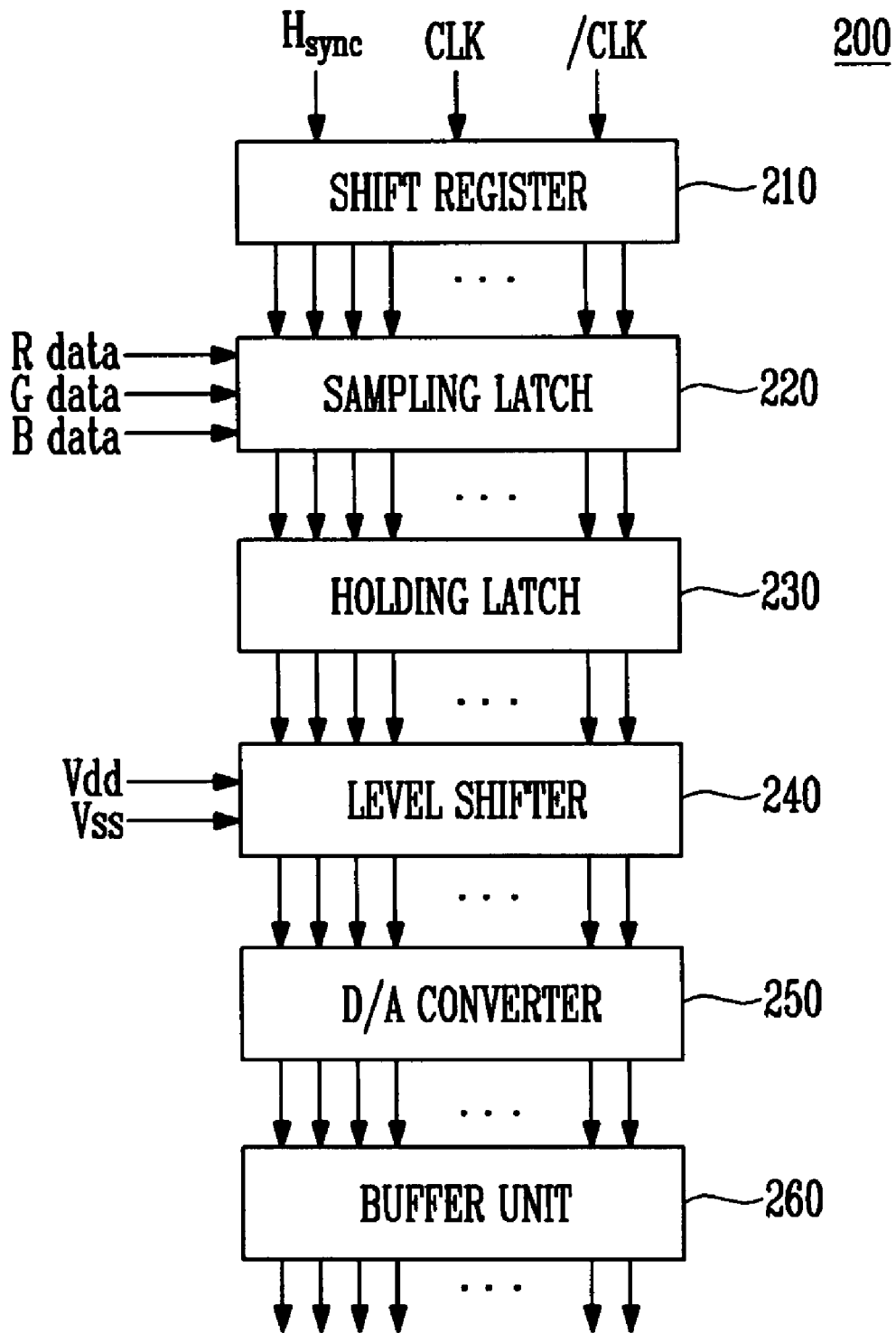
FIG. 3 illustrates a block diagram of a data driver used in an OLED display device according to an embodiment of the present invention.

FIG. 3 illustrates a block diagram of a data driver used in an OLED display device according to an embodiment of the present invention.

Referring to FIG. 3, the data driver 200 may include a shift register 210, a sampling latch 220, a holding latch 230, a level shifter 240, a D/A converter 250 and a buffer unit 260. The shift register 210 may include multiple flip flops. The shift register 210 may control the sampling latch 220 to correspond to at least one clock signal CLK and a synchronizing signal Hsync. The sampling latch 220 may sequentially receive data signals of one row and output the received R, G and B data signals in parallel, depending on a control signal of the shift resistor 210. A process in which the signals may be sequentially received and output in parallel may be referred to as SIPO (Serial In Parallel Out). The holding latch 230 may receive signals in parallel and may output the received signals in parallel. A process in which the signals may be received in parallel and output in parallel may be referred to as PIPO (Parallel In Parallel Out). The level shifter 240 may convert the signals, output from the holding latch 230, to an operation voltage of the system and may transmit the converted signals to the D/A converter 250. The level shifter 240 may employ supply voltages Vdd and Vss. The D/A converter 250 may convert the converted signals to an analog signal, may select a corresponding gray level voltage, and may transmit the selected gray level voltage to the buffer unit 260. The buffer unit 260 may amplify the gray level voltage and may transmit the amplified gray level voltage to the data lines.

Figure 4:
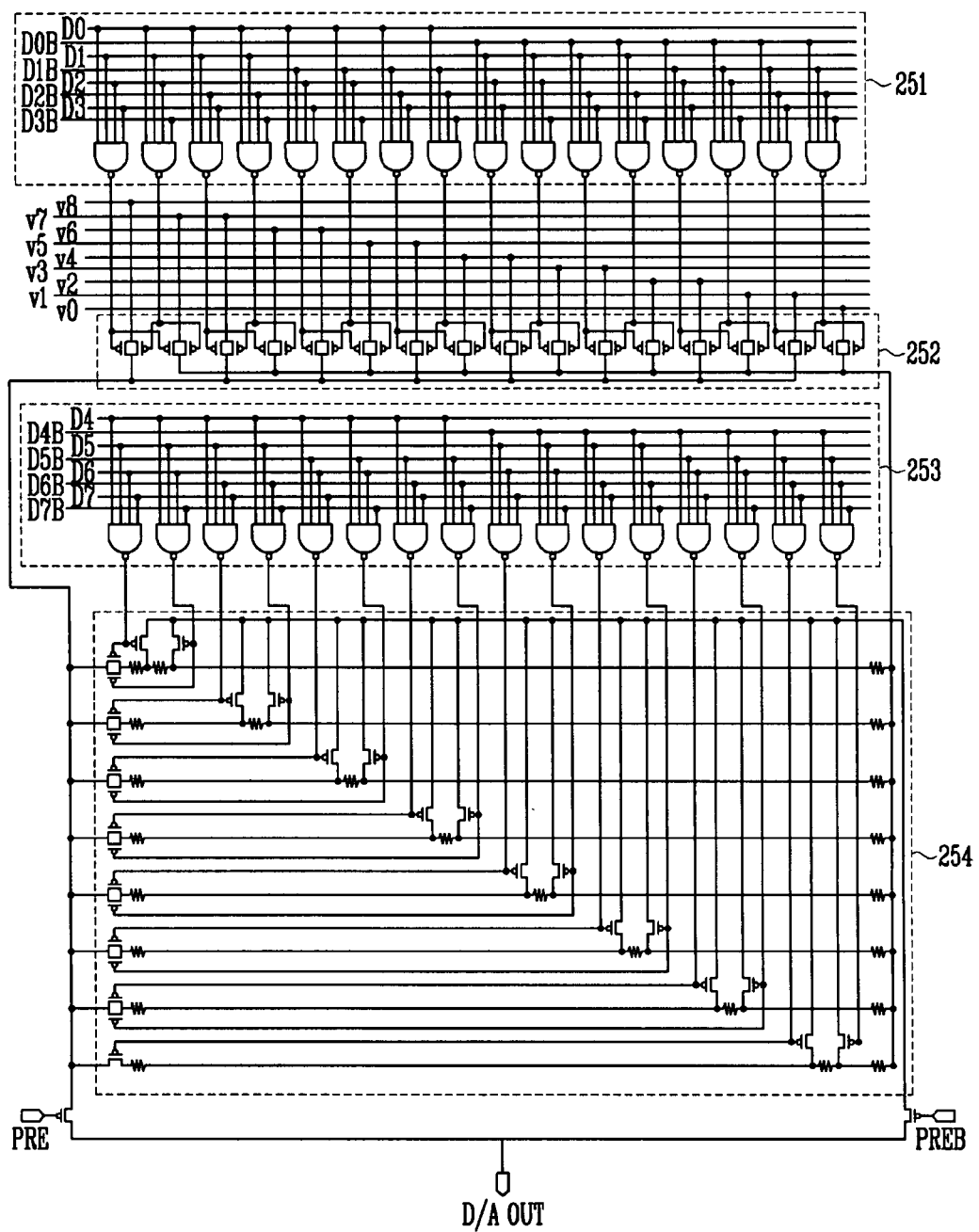
FIG. 4 illustrates a schematic view of a D/A converter according to an embodiment of the present invention.

FIG. 4 illustrates a schematic view of the D/A converter 250 according to an embodiment of the present invention.

Referring to FIG. 4, the D/A converter 250 may include a first decoder 251, a switch unit 252, a second decoder 253 and a data voltage generation unit 254. In the D/A converter 250, the data signal may be composed of eight-bit signals to display 256 gray levels. The first decoder 251 may use an upper 4 bits of the data signal from data lines D0 . . . D3 and D0b . . . D3B to generate 16 first decoding signals. The first decoder 251 may include 16 NAND gates, and may use upper 4-bit signals of the data signal and their accessory signals to generate 16 first decoding signals. The first decoder 251 may then select one NAND gate out of the 16 NAND gates to output the first decoding signal. For convenience, a leftmost NAND gate may be referred to as a first NAND gate, the next NAND gate may be referred to as a second NAND gate, etc.

The switch unit 252 may select two reference voltage lines out of the nine reference voltage lines (V0, V1 . . . V8) to select the first reference voltage RefH and the second reference voltage RefL out of the multiple reference voltages, where the second reference voltage RefL may be lower than the first reference voltage RefH. The switch unit 252 may include 32 transistors arranged in 16 pairs. The transistors forming one leftmost pair may be referred to as a first transistor and a second transistor, the transistors forming the next pair may be referred to as a third transistor and a fourth transistor, etc. The two transistors forming a pair may each have sources connected to one reference voltage line out of the 9 reference voltage lines, and gates connected respectively to the first NAND gate and the second NAND gate. Accordingly, if the first decoding signal is output through the first NAND gate, then the first transistor and the third transistor may be in a turned-on state, and the first reference voltage and the second reference voltage may be selected and transmitted to the data voltage generation unit.

The second decoder 253 may use lower 4 bits of the data signal from data lines D4 . . . D7 and D4B . . . D7B to generate 16 second decoding signals. The second decoder 253 may include 16 NAND gates, and may use lower 4-bit signals of the data signal and their accessory signals to generate 16 second decoding signals. The second decoder 253 may then select one NAND gate out of the 16 NAND gates to output the second decoding signal. For convenience, a leftmost NAND gate may be referred to as a seventeenth NAND gate, the next NAND gate may be referred to as an eighteenth NAND gate, etc.

The data voltage generation unit 254 may include eight voltage distribution units. Each of the voltage distribution units may include resistor arrays composed of four transistors and three resistors. Two transistors may receive the first reference voltage RefH through the source, and may have a drain connected to one terminal of the resistor array. Gates may be connected respectively to adjacent NAND gates. The two remaining transistors may have a source connected respectively to both ends of the resistance arranged in a central region of the three resistor array, a drain connected to an output terminal, and a gate connected respectively to the seventeenth NAND gate and the eighteenth NAND gate. The transistors may be connected respectively to output lines, and the transistors may be driven by a preset signal PRE and a preset bar signal PREB.

The first reference voltage RefH and the second reference voltage RefL may be selected with 16 gray levels by the first decoder 251, and the data voltage may also be selected with 16 gray levels by the second decoder 254. Therefore, it may be possible to display 256 gray levels.

Figure 5:
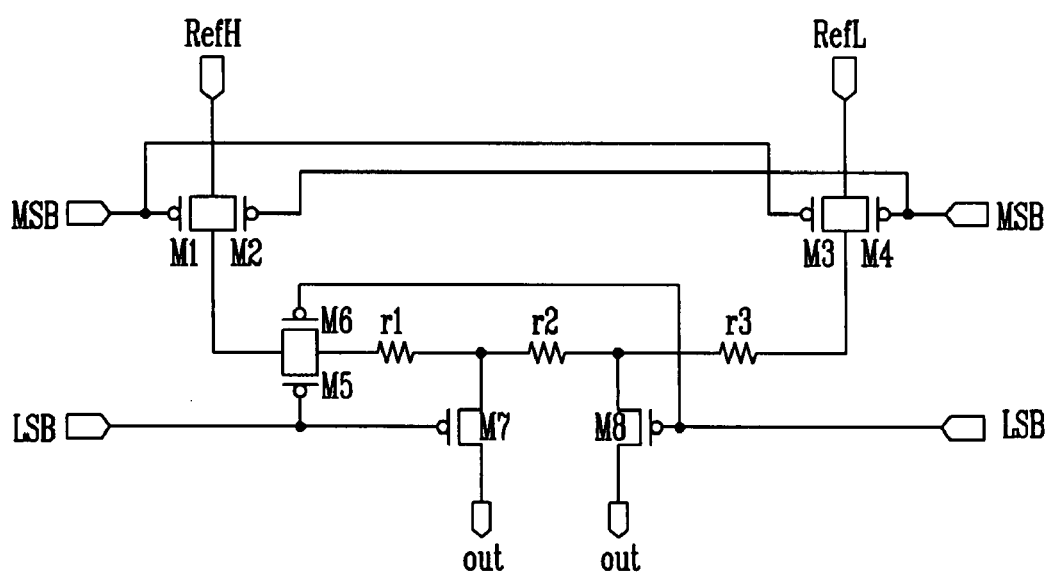
FIG. 5 illustrates a circuit view of a data voltage generation unit connected to a switch unit in the D/A converter according to an embodiment of the present invention.

FIG. 5 illustrates a circuit view of the data voltage generation unit 254 connected to the switch unit 252 in the D/A converter 250.

Referring to FIG. 5, the switch unit 252 may include first to fourth transistors M1 to M4, where the first transistor M1 and the second transistor M2 may switch the first reference voltage RefH, and the third transistor M3 and the fourth transistor M4 may switch the second reference voltage RefL. A most significant bit MSB signal may be connected to each of the first transistor M1 to the fourth transistor M4. The data voltage generation unit 254 may include a fifth transistor M5, a sixth transistor M6, a resistor array including first, second and third resistors r1, r2, r3 connected in series, a seventh transistor M7 connected between the first resistor r1 and the second resistor r2 to transmit signals to a first output terminal out, and an eighth transistor M8 connected between the second resistor r2 and the third resistor r3 to transmit signals to a second output terminal out. A least significant bit LSB signal may be connected to gates of the fifth transistor M5, the sixth transistor M6, the seventh transistor M7, and the eighth transistor M8. The switching resistance of the first transistor M1 may be referred to as Ra (see FIG. 2), a resistance of the second transistor M2 may be referred to as Rc, a resistance of the third transistor M may be referred to as Rb (see FIG. 2), a resistance of the fourth transistor M4 may be referred to as Rd, a resistance of the fifth transistor M5 may be referred to as Re, and a resistance of the sixth transistor M6 may be referred to as Rf.

Figure 6:
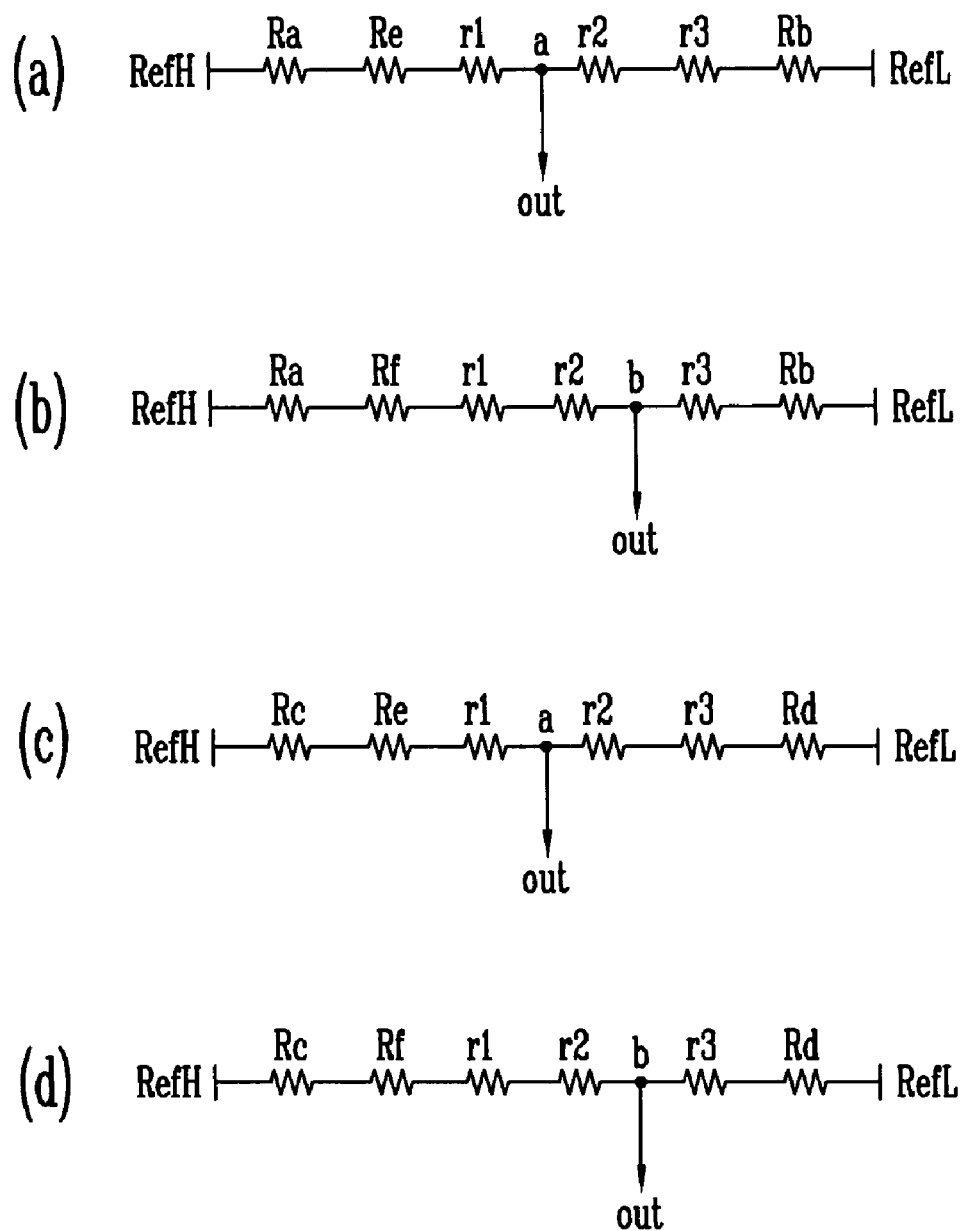
FIG. 6 illustrates an equivalent circuit view of a resistor array for generating a gray level voltage.

The first transistor M1 and the third transistor M3 may be controlled in the same manner. The second transistor M2 and the fourth transistor M4 may be controlled in the same manner. The fifth transistor M5 and the seventh transistor M7 may be controlled in the same manner. The sixth transistor M6 and the eighth transistor M8 may be controlled in the same manner. The data voltage generation unit may utilize each of four resistor arrays, depending on the switching operation of each of the transistors, as illustrated in FIG. 6. That is, four gray level voltages may be output by employing the first reference voltage RefH and the second reference voltage RefL.

FIG. 6 illustrates various configurations possible between the first reference voltage RefH and the second reference voltage RefL. In FIG. 6(a), a gray level voltage may be output from node a between resistors r1 and r2 in a configuration which includes transistor resistances Ra, Re and Rb. In FIG. 6(b), a gray level voltage may be output from node b between resistors r2 and r3 in a configuration which includes transistor resistances Ra, Rf and Rb. In FIG. 6(c), a gray level voltage may be output from node a between resistors r1 and r2 in a configuration which includes transistor resistances Rc, Re and Rd. In FIG. 6(d), a gray level voltage may be output from node b between resistors r2 and r3 in a configuration which includes transistor resistances Rc, Rf and Rd.

Accordingly, eight voltage distribution units may generate a total of thirty-two gray level voltages, since four gray level voltages may be generated in one data voltage generation unit.

Figure 7:
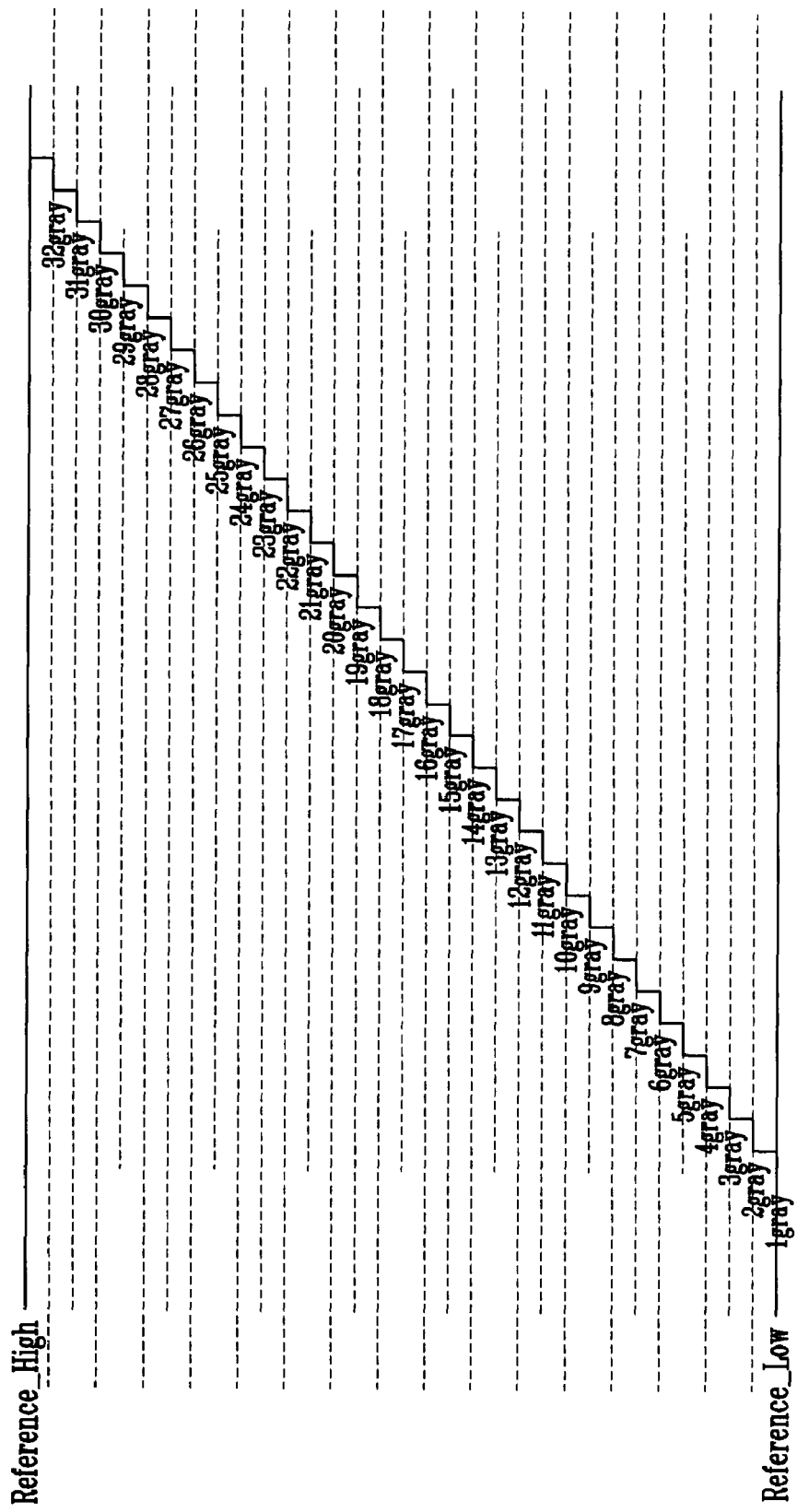
FIG. 7 illustrates a diagram of a gray level voltage generated in a voltage distribution unit and a first selection unit of FIG. 5.

FIG. 7 illustrates a diagram of a gray level voltage which may be generated in data voltage generation unit 254 and the switch unit 252 of FIG. 5.

Referring to FIG. 7, when the first reference voltage and the second reference voltage are selected, the first gray level voltage and the second gray level voltage may be divided into 16 levels and may define an intermediate value in each step to generate a total of 32 gray level voltages. When the data signal is composed of 6 bits, the data signal may be firstly divided into 16 gray levels to generate the total of 16 gray level voltages. When the data signal is composed of 7 bits or 8 bits, then the data signal may generate the entire 32 gray level voltages.

Figure 8:
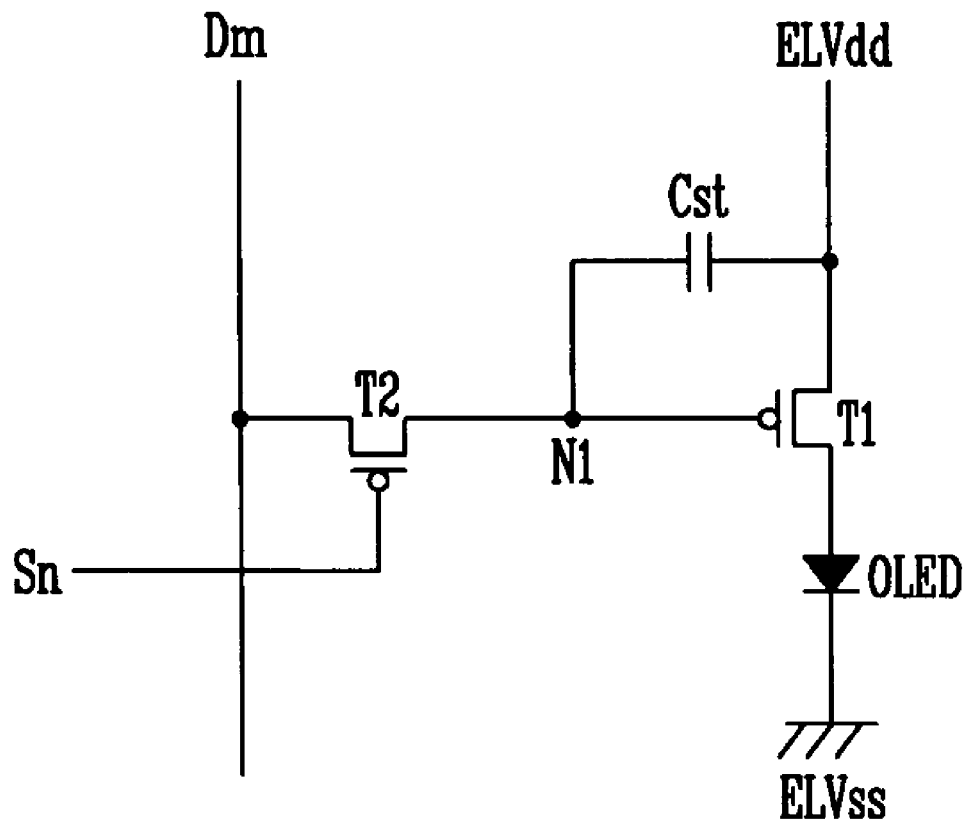
FIG. 8 illustrates a circuit diagram of an example of a pixel used in the OLED display device of FIG. 2.

FIG. 8 illustrates a circuit view of one example of the pixel 101 used in the OLED display device as shown in FIG. 2. Referring to FIG. 8, the pixel 101 may be connected a data line Dm, a scan line Sn, and a pixel power line ELVdd, and may include a first transistor T1, a second transistor T2, a capacitor Cst, and an OLED.

The first transistor T1 may have a source connected to a pixel power line ELVdd, a drain connected to the OLED, and a gate connected to a first node N1. The second transistor T2 may have a source connected to the data line Dm, a drain connected to the first node N1, and a gate connected to the scan line Sn. The capacitor Cst may be connected between the first node N1 and the pixel power line ELVdd to maintain a voltage between the first node N1 and the pixel power line ELVdd for a predetermined time. The OLED may include an anode electrode, a cathode electrode and a light emitting layer. The anode electrode of the OLED may be connected to the drain of the first transistor T1, the cathode electrode may be connected to the power source ELVss having a low electric potential, and light may be emitted from the light emitting layer. Brightness may be controlled to correspond to an electric current capacity if an electric current flows from the anode electrode to the cathode electrode of the OLED to correspond to a voltage applied to the gate of the first transistor T1.

The driving circuit according to the present invention and the OLED display device thereof may be useful to reduce an area of the D/A converter by reducing the wire number of the reference voltages for generating multiple gray levels of the data signal, thereby to reduce a size of the data driver. Also, an area of a dead space in the OLED display device may be reduced by reducing the size of the data driver.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A driving circuit for generating a data voltage, comprising:
    a first decoder adapted to output a plurality of first decoding signals using upper bits of a digital data signal;
    a switch unit adapted to select a first reference voltage and second reference voltage from a plurality of reference voltages corresponding to the plurality of first decoding signals, the second reference voltage being lower than the first reference voltage, wherein two first decoding signals select identical first and second reference voltages;
    a second decoder adapted to output a plurality of second decoding signals using lower bits of the digital data signal; and
    a plurality of voltage distribution units adapted to receive and distribute the first reference voltage and the second reference voltage, wherein one of the voltage distribution units includes a data voltage generation unit adapted to receive two of the second decoding signals to generate a data voltage.

2. The driving circuit as claimed in claim 1, wherein the switch unit selects two reference voltage lines from nine reference voltage lines to select the first reference voltage and the second reference voltage.

3. The driving circuit as claimed in claim 1, wherein the switch unit comprises:
    a first transistor adapted to receive a primary first decoding signal out of the plurality of first decoding signals to switch the first reference voltage;
    a second transistor adapted to receive a secondary first decoding signal out of the plurality of first decoding signals to switch the first reference voltage;
    a third transistor adapted to receive the primary first decoding signal to switch the second reference voltage; and
    a fourth transistor adapted to receive the secondary first decoding signal to switch the second reference voltage.

4. The driving circuit as claimed in claim 3, wherein the primary first decoding signal and the secondary first decoding signal are transmitted at different times.

5. The driving circuit as claimed in claim 1, wherein the data voltage generation unit is adapted to receive the first reference voltage and the second reference voltage and to generate a plurality of gray level voltages, wherein the data voltage generation unit uses a resistance ratio to generate four of the gray level voltages.

6. The driving circuit as claimed in claim 1, wherein the data voltage generation unit comprises:
    a first transistor adapted to switch the first reference voltage to correspond to a primary second decoding signal out of the plurality of second decoding signals;
    a second transistor adapted to switch the first reference voltage to correspond to a secondary second decoding signal out of the plurality of second decoding signals;
    a resistor array having first, second and third resistors connected in series, the resistor array being between the first reference voltage and the second reference voltage;
    a third transistor between the first and second resistors, and adapted to output a gray level voltage of a data signal corresponding to the primary second decoding signal; and
    a fourth transistor between the second and third resistors, and adapted to output a gray level voltage of a data signal corresponding to the secondary second decoding signal.

7. The driving circuit as claimed in claim 6, wherein the primary second decoding signal and the secondary second decoding signal are transmitted at different times.

8. A data driver, comprising:
    a shift register unit adapted to sequentially output control signals;
    a latch unit adapted to output parallel digital data signals input in series to correspond to the control signal;
    a D/A converter unit adapted to convert the digital data signals to a data voltages; and
    a buffer unit amplifying the data voltages, wherein the D/A converter unit includes:
a first decoder adapted to output a plurality of first decoding signals using upper bits of the digital data signals;
a switch unit adapted to select a first reference voltage and second reference voltage from a plurality of reference voltages corresponding to the plurality of first decoding signals, the second reference voltage being lower than the first reference voltage, two first decoding signals out of the plurality of first decoding signals selecting identical first and second reference voltages;
a second decoder adapted to output a plurality of second decoding signals using lower bits of the digital data signal; and
a plurality of voltage distribution units adapted to receive and distribute the first reference voltage and the second reference voltage, wherein one voltage distribution unit includes a data voltage generation unit adapted to receive two of the second decoding signals to generate a data voltage.

9. The data driver as claimed in claim 8, wherein the switch unit selects two reference voltage lines from nine reference voltage lines to select the first reference voltage and the second reference voltage.

10. The data driver as claimed in claim 8, wherein the switch unit comprises:
a first transistor adapted to receive a primary first decoding signal out of the plurality of first decoding signals to switch the first reference voltage;
a second transistor adapted to receive a secondary first decoding signal out of the plurality of first decoding signals to switch the first reference voltage;
a third transistor adapted to receive the primary first decoding signal to switch the second reference voltage; and
a fourth transistor adapted to receive the secondary first decoding signal to switch the second reference voltage.

11. The data driver as claimed in claim 10, wherein the primary first decoding signal and the secondary first decoding signal are transmitted at different times.

12. The data driver as claimed in claim 8, wherein the data voltage generation unit is adapted to receive the first reference voltage and the second reference voltage to generate a plurality of gray level voltages, wherein the data voltage generation unit uses a resistance ratio to generate four of the gray level voltages.

13. The data driver as claimed in claim 8, wherein the data voltage generation unit comprises:
a first transistor adapted to switch the first reference voltage to correspond to a primary second decoding signal out of the plurality of second decoding signals;
a second transistor adapted to switch the first reference voltage to correspond to a secondary second decoding signal out of the plurality of second decoding signals;
a resistor array having first, second and third resistors connected in series between the first reference voltage and the second reference voltage;
a third transistor between the first and second resistors, the third transistor outputting a gray level voltage of a data signal corresponding to the primary second decoding signal; and
a fourth transistor between the second and third resistors, the fourth transistor adapted to output a gray level voltage of a data signal corresponding to the secondary second decoding signal.

14. The data driver as claimed in claim 13, wherein the primary second decoding signal and the secondary second decoding signal are transmitted at different times.

15. An organic light emitting diode display device, comprising:
a pixel unit adapted to receive a data voltage and a scan signal;
a data driver adapted to generate the data voltage; and
a scan driver adapted to generate the scan signal,
wherein the data driver includes:
a first decoder adapted to output a plurality of first decoding signals using upper bits of a digital data signal;
a switch unit adapted to select a first reference voltage and a second reference voltage from a plurality of reference voltages corresponding to a the plurality of first decoding signals, the second reference voltage being lower than the first reference voltage, two first decoding signals out of the plurality of the first decoding signals selecting identical first and second reference voltages;
a second decoder adapted to output a plurality of second decoding signals using lower bits of the digital data signal; and
a plurality of voltage distribution units adapted to receive and distribute the first reference voltage and the second reference voltage, wherein one voltage distribution unit includes a data voltage generation unit for receiving two second decoding signals to generate a data voltage.

16. The organic light emitting diode display device as claimed in claim 15, wherein the switch unit is adapted to select two reference voltage lines from nine reference voltage lines to select the first reference voltage and the second reference voltage.

17. The organic light emitting diode display device as claimed in claim 15, wherein the switch unit comprises:
a first transistor adapted to receive a primary first decoding signal out of the plurality of first decoding signals to switch the first reference voltage;
a second transistor adapted to receive a secondary first decoding signal out of the plurality of first decoding signals to switch the first reference voltage;
a third transistor adapted to receive the primary first decoding signal to switch the second reference voltage; and
a fourth transistor adapted to receive the secondary first decoding signal to switch the second reference voltage.

18. The organic light emitting diode display device as claimed in claim 17, wherein the primary first decoding signal and the secondary first decoding signal are transmitted at different times.

19. The organic light emitting diode display device as claimed in claim 15, wherein the data voltage generation unit is adapted to receive the first reference voltage and the second reference voltage to generate a plurality of gray level voltages, wherein the data voltage generation unit is adapted to employ a resistance ratio to generate four of the gray level voltages.

20. The organic light emitting diode display device as claimed in claim 15, wherein the data voltage generation unit comprises:
a first transistor adapted to switch the first reference voltage to correspond to a primary second decoding signal out of the plurality of the second decoding signals;

a second transistor adapted to switch the first reference voltage to correspond to a secondary second decoding signal out of the plurality of second decoding signals;

a resistor array having first, second and third resistors connect in series and arranged between the first reference voltage and the second reference voltage;

a third transistor between the first and second resistors, the third transistor being adapted to output a gray level voltage of a data signal corresponding to the primary second decoding signal; and a fourth transistor between the second and third resistors, the fourth transistor being adapted to output a gray level voltage of a data signal corresponding to the secondary second decoding signal.

21. The organic light emitting diode display device as claimed in claim 20, wherein the primary second decoding signal and the secondary second decoding signal are transmitted at different times.

* * * * *